United States Patent
Tseng (10) Patent No.: US 7,034,734 B2
(45) Date of Patent: Apr. 25, 2006

(54) DIGITAL TO ANALOG CONVERTER AND DISPLAY INCORPORATING THE SAME

(75) Inventor: Jung-Chun Tseng, Dongning Village (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/146,768

(22) Filed: Jun. 7, 2005
(Under 37 CFR 1.47)

(65) Prior Publication Data

US 2005/0270209 A1   Dec. 8, 2005

(30) Foreign Application Priority Data

Jun. 8, 2004   (TW) ............... 93116403 A (51) Int. Cl.
*H03M 1/80*   (2006.01)

(52) U.S. Cl. .................... 341/153; 345/89; 345/691

(58) Field of Classification Search ................ 341/100, 341/153, 144, 50; 345/89, 691
See application file for complete search history.

(56) References Cited

U.S. PATENT DOCUMENTS

| | | | |
|---|---|---|---|
| 5,453,743 A * | 9/1995 | Kang .................... | 341/144 |
| 5,831,588 A * | 11/1998 | Hotto .................... | 345/100 |
| 5,861,869 A * | 1/1999 | Scheffer et al. ......... | 345/691 |
| 6,163,283 A * | 12/2000 | Schofield ............... | 341/50 |
| 6,359,467 B1 | 3/2002 | McCarroll et al. ........ | 326/37 |
| 6,567,304 B1 | 5/2003 | Kleveland .............. | 365/185.03 |
| 2002/0008684 A1 * | 1/2002 | Udo et al. | |
| 2004/0100399 A1 * | 5/2004 | Sun | |

FOREIGN PATENT DOCUMENTS

| | | |
|---|---|---|
| TW | 466870 | 9/1988 |
| TW | 529299 | 10/1989 |

* cited by examiner

*Primary Examiner*—Jean Bruner Jeanglaude
(74) *Attorney, Agent, or Firm*—Thomas, Kayden, Horstemeyer & Risley (57) ABSTRACT

A digital to analog converter is provided. The digital to analog converter comprises a digital data input, a decoder, a re-queuing circuit and a plurality of current cells. The digital data input receives a digital input data. The decoder decodes the digital input data and generates a decoded data. The re-queuing circuit changes a bit sequence of decoded data and outputs a re-queued data. Each current cell comprises a current source and an internal logic gate. The internal logic gate determines whether the current source outputs the current according to the re-queued data.

14 Claims, 9 Drawing Sheets

DIGITAL TO ANALOG CONVERTER AND DISPLAY INCORPORATING THE SAME

This application claims the benefit of Taiwan application Serial No. 93,116,403, filed Jun. 8, 2004, the subject matter of which is incorporated herein by reference.

BACKGROUND

The invention relates in general to a digital to analog converter, and more particularly to a current-driven thermometer code digital to analog converter.

Organic light emitting diode (OLED) displays are among currently prevailing flat panel displays. Since the brightness of an OLED is proportional to the current conducted thereby, variations of current level have great impact on uniformity of an OLED display, and improvement of a current-driving structure increases display uniformity. Thus, the quality of a current-driven digital to analog converter is critical to current output and display quality.

A thermometer code digital to analog converter is current driven and has advantages such as fast response and accurate current output. The operational duration of current sources in a conventional structure, however, differ.

FIGS. 1A–1D are illustrations of current outputs of a 4-bit thermometer code digital to analog converter. The digital input data of FIGS. 1A–1D are (0000), (0001), (1000) and (1111), respectively. The shadowed current sources are turned on to output current. From FIGS. 1A–1D, it is found that a current source 101 is always on except in the case where the digital input data is (0000). To the contrary, a current source 116 is always off except in the case where the digital input data is (1111). In a conventional structure of a current driver, a thin film transistor in the current cell 101 is often influenced by current stress. This results in device degradation and thermometer code digital to analog converter malfunctions.

Figure 1A:
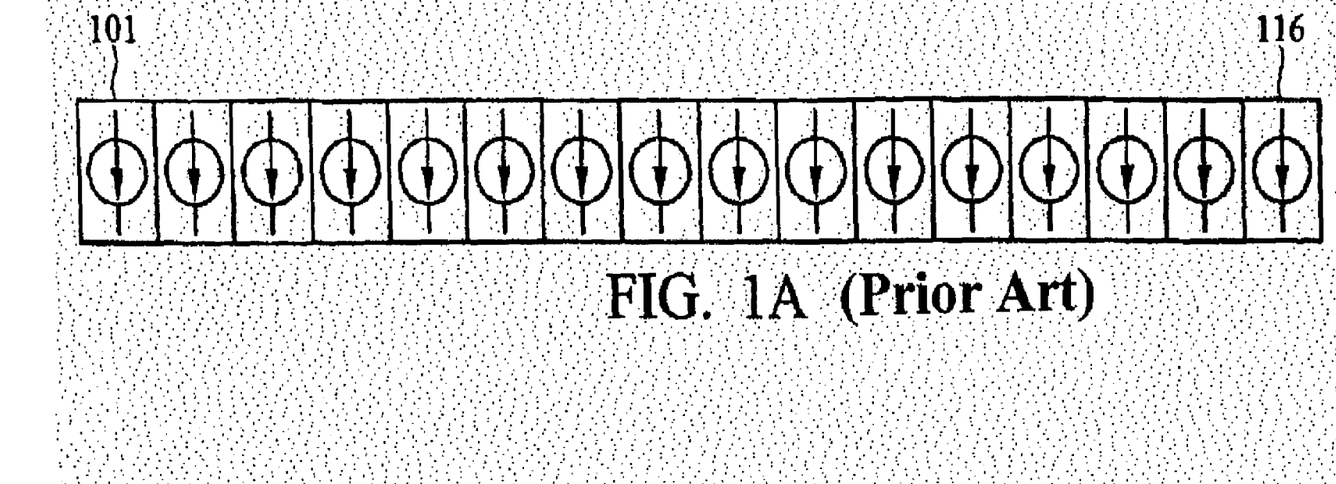
FIGS. 1A–1D illustrate current outputs of a 4-bit thermometer code digital to analog converter.
Figure 1B:
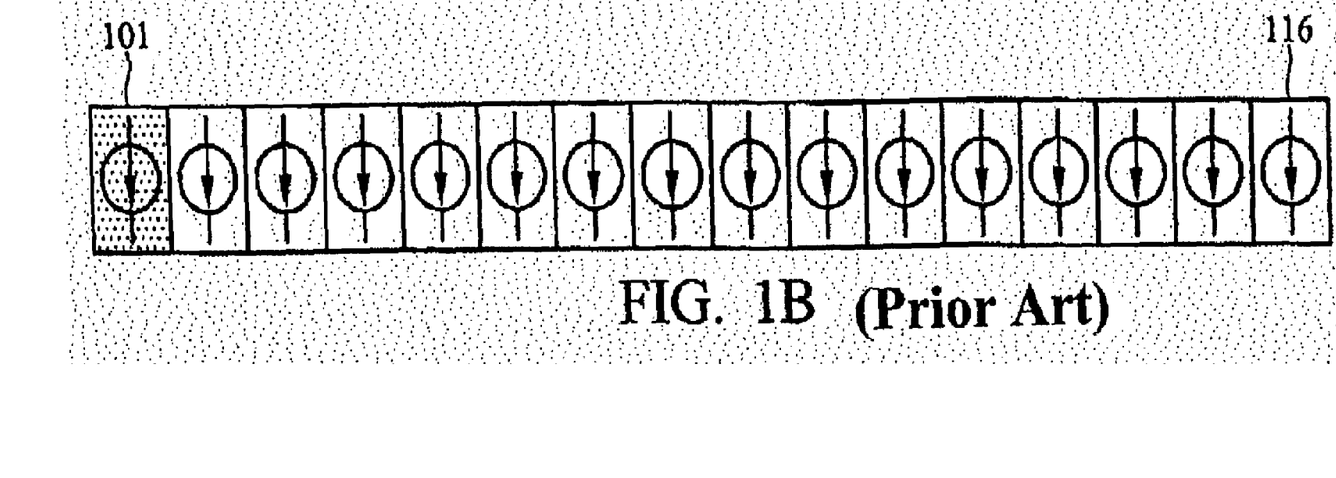
Figure 1C:
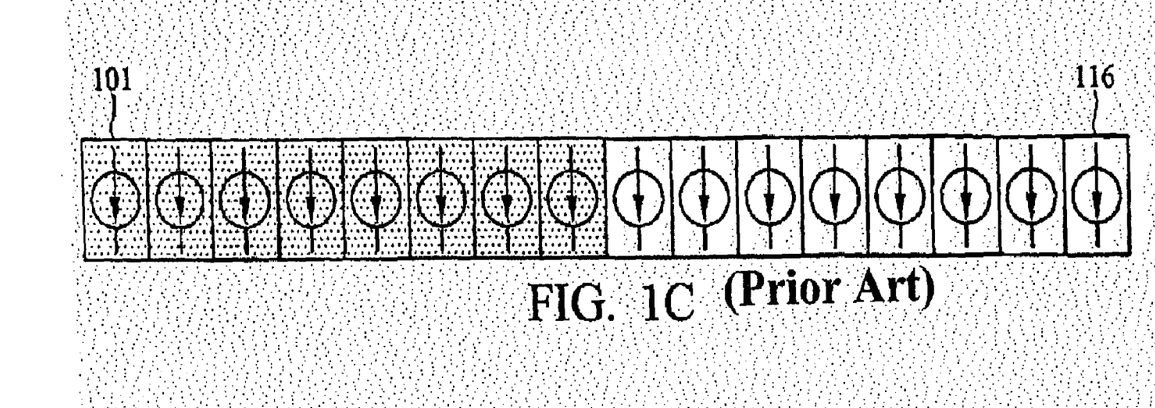
Figure 1D:
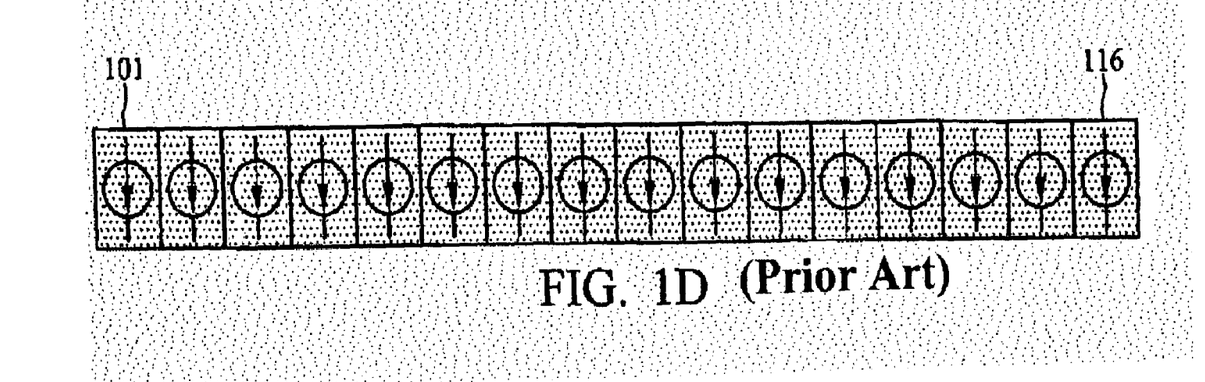
Figure 2A:
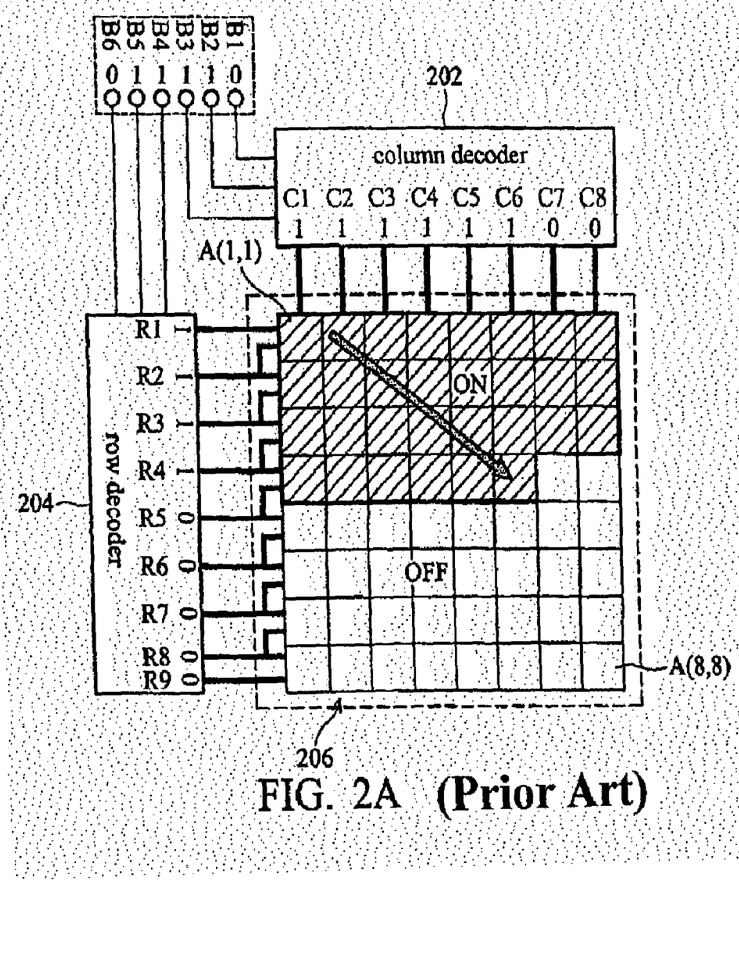
FIG. 2A shows a conventional 6-bit thermometer code digital to analog converter.
Figure 2B:
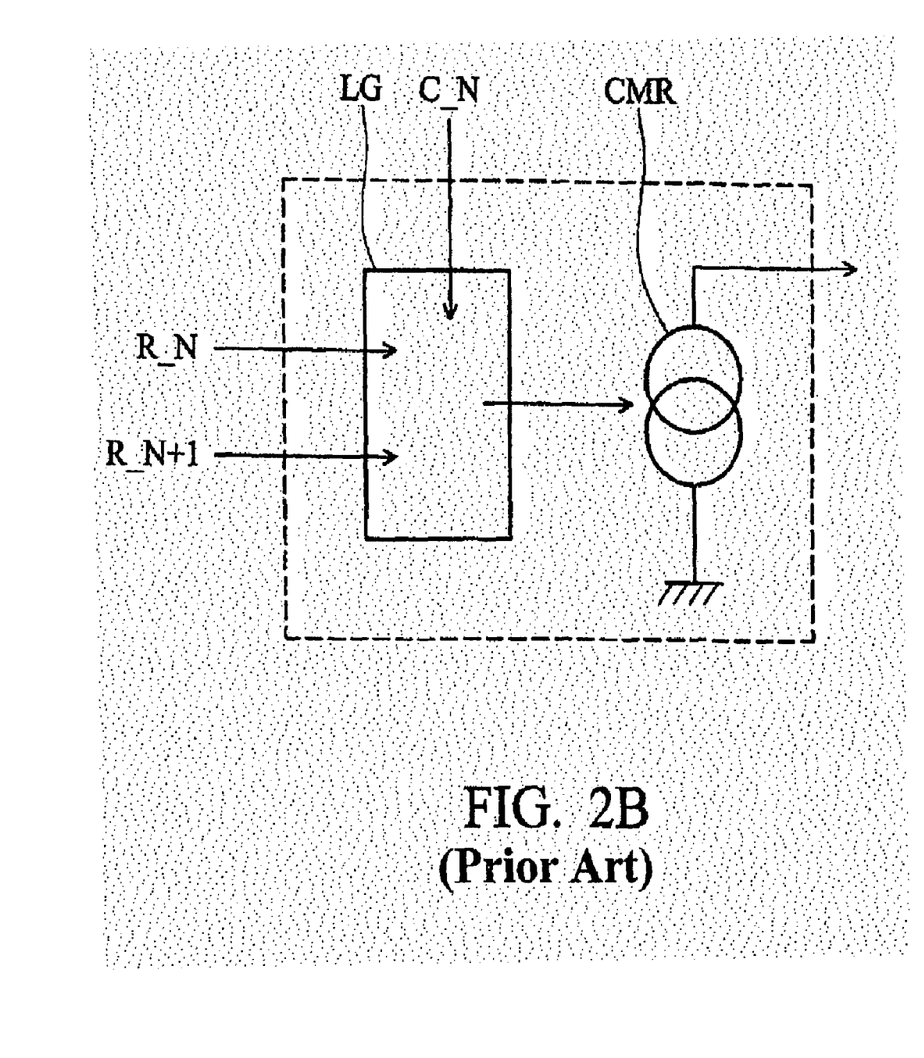
FIG. 2B shows the structure of the current cell in FIG. 2A.

FIG. 2A shows a conventional 6-bit thermometer code digital to analog converter. The thermometer code digital to analog converter includes digital data input B1~B6, a column decoder 202, a row decoder 204 and a current cell array 206. The digital data input B1~B6 represent the least significant bit (LSB) to the most significant bit (MSB) of the 6-bit digital input data, respectively. The column decoder 202 decodes the bits B1~B3 and outputs signals C1~C7. The column decoder 204 decodes the bits B4~B6 and outputs signals R2~R8. R1 is a fixed high voltage level while C8 and R9 are fixed at a low voltage level. The current cell array 206 includes 64 current cells A(1,1)~A(8,8). Each of the current cells A(1,1)~A(8,8) includes a current mirror CMR and a logic gate LG, as shown in FIG. 2B. The logic gate LG receives one of the signals C1~C8, represented by C_N, and two of the signals R1~R9, represented by R_N and R_N+1, and afterward outputs a logic signal to control ON/OFF of the current mirror CMR.

Take a 6-bit digital input data (011110) as an example. Operation of the current cell array 206 is shown in FIG. 2A. Thirty ones of the current cells, shadowed in the figure, are turned on, while others do not output current. From the explanation of FIG. 1, the current cell A(1,1) is the most one often turned on. In other words, the current cell A(1,1) is often influenced by a current stress. This results in degradation of device characteristics and an abnormal current output.

SUMMARY

Embodiments of the invention provide a thermometer code digital to analog converter. The operational duration of each current cell in the digital to analog converter is substantially equivalent. The lifetime of thin film devices can be longer and which are less affected by a current stress.

A digital to analog converter according to one embodiment of the invention includes a digital data input, a column decoder, a row decoder, a re-queuing circuit and a plurality of current cells. The digital data input receives digital input data. The decoder decodes the digital input data and generates decoded data. The re-queuing circuit changes sequence of bits of the decoded data and outputs re-queued data. Each current cell includes a current source and an internal logic gate. The internal logic gate determines whether the current source outputs the current according to the re-queued data.

A display, which may be an OLED display, according to another embodiment of the invention includes a pixel array, a scan driver and a data driver. The scan driver sequentially turns on a row of the pixels in the pixel array. The data driver includes a digital to analog converter. The digital to analog converter includes a digital data input, a column decoder, a row decoder, a re-queuing circuit and a plurality of current cells. The digital data input receives column or row digital input data. The column or row decoder decodes the column or row digital input data and generates column or row decoded data. The column or row re-queuing circuit changes sequence of bits in the column or row decoded data and outputs column or row re-queued data. Each current cell includes a current source and an internal logic gate. The internal logic gate determines whether the current source outputs the current according to the column or row re-queued data.

The invention provides a digital to analog converter. The vertical start pulse STV and horizontal start pulse STH of an OLED display are utilized to create a switch signal. The output data generated from the column decoder and the row decoder are re-queued according to the switch signal. Operating duration of each current cell in the digital to analog converter is thus substantially equivalent and circuit lifetime is longer. Output accuracy and reliability are both achieved by using the digital to analog converter according to embodiments of the invention.

DETAILED DESCRIPTION

Figure 3A:
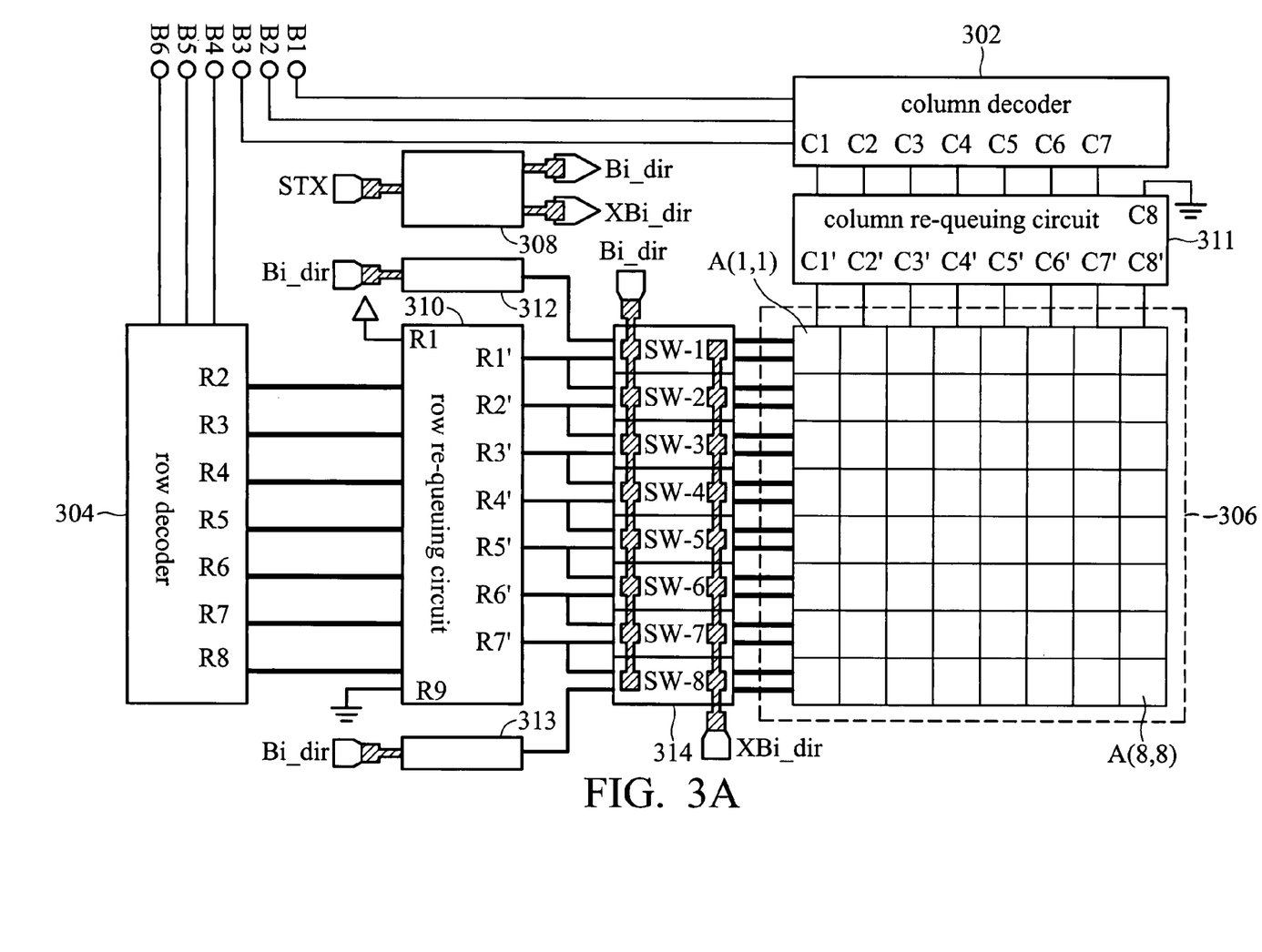
FIG. 3A shows a schematic diagram of a digital to analog-converter according to an embodiment of the invention.

FIG. 3A shows a schematic diagram of a digital to analog converter according to an embodiment of the invention. The digital to analog converter includes digital data input B1~B6, a column decoder 302, a row decoder 304 and a current cell array 306, a switch signal generator 308, a row re-queuing circuit 310, a column re-queuing circuit 311, a first logic gate 312, a second logic gate 313 and a switch module 314. The digital data input B1~B6 represents the least significant bit (LSB) to the most significant bit (MSB) of the 6-bit input data, respectively. The column decoder 302 decodes the bits B1~B3, so-called column digital input data, and outputs signals C1~C7, so-called column decoded data. The row decoder 304 decodes the bits B4~B6, so-called row digital input data, and outputs signals R2~R8, so-called row decoded data. In FIG. 3A, R1 is a fixed high voltage level, while C8 and R9 are fixed at a low voltage level represented by ground.

Figure 3B:
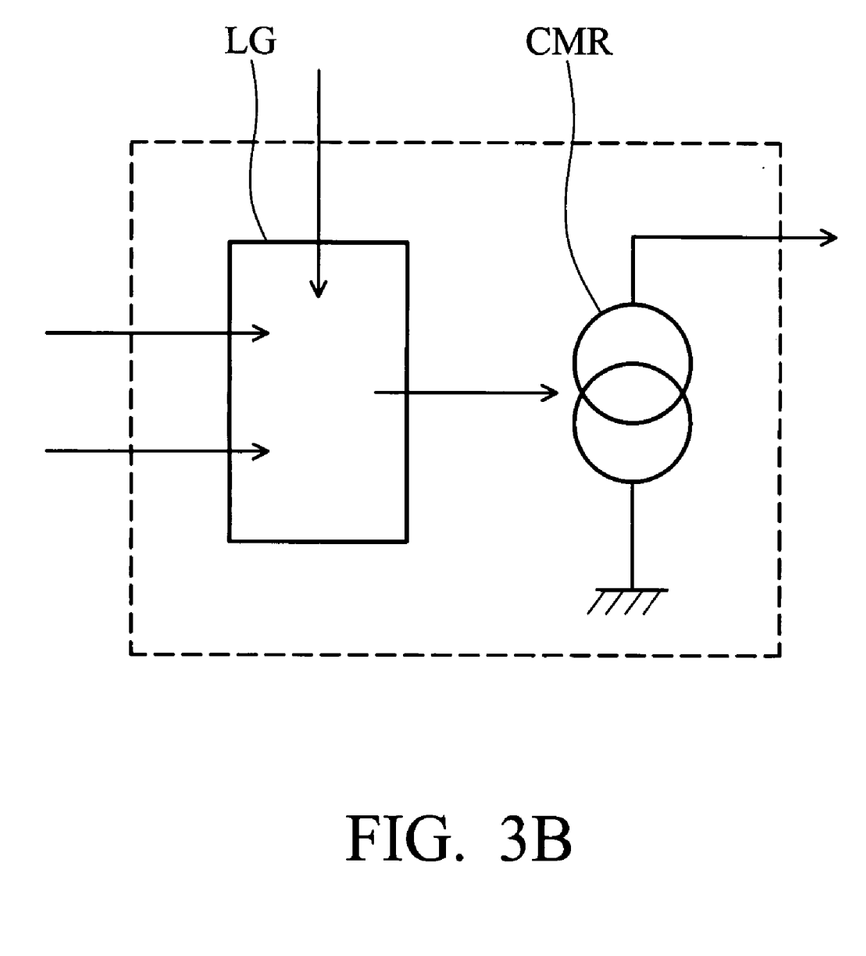
FIG. 3B shows the structure of the current cell shown in FIG. 3A.

The switch signal generator receives an input signal STX, which can be STV or STH. STV is a vertical start pulse and STH is a horizontal start pulse. Output signals of the switch signal generator 308 are complementary signals Bi_dir and XBi_dir. The row re-queuing circuit 310 and column re-queuing circuit 311 are controlled by the signal Bi_dir. The main function of the re-queuing circuits is to re-queue the signals C1~C8 and R1~R9 according to the signal Bi_dir and output C1'~C8', so-called column re-queued decoded data, and R1'~R7', so-called row re-queued decoded data. More specifically, the row re-queuing circuit 310 and column re-queuing circuit 311 are bi-directional circuits, which reverse the output sequence of signals C1~C8 and R1~R9 according to the signal Bi_dir. The switch module 314 includes switches SW-1~SW-8, controlled by the signals Bi_dir and XBi_dir, respectively. Each of the switches SW-2~SW-7 switches two of the signals R1'~R7' and provides the switched signals to the internal logic gates in the current cells in row 2 to row 7 according to the signal Bi_dir. Similarly, the switch SW-1 switches the signal R1' and an output signal of a first logic gate 312 and provides the switched signals to the internal logic gates in the current cells in row 1 according to the signal Bi_dir. The switch SW-8 switches the signal R7' and an output signal of a second logic gate 313 and provides the switched signals to the internal logic gates in the current cells in row 8 according to the signal Bi_dir. Alternatively, the switch module 314 is connected to the column re-queuing circuit 311 and the current cell array. The first logic gate 312 receives the signal Bi_dir and outputs a signal to the switch SW-1. The first logic gate 313 also receives the signal Bi_dir and outputs another signal to the switch SW-8. The current cell array includes 64 unit current cells A(1,1)~A(8,8). Each of the current cells A(1,1)~A(8,8) includes a current mirror CMR and an internal logic gate LG, as shown in FIG. 3B. The internal logic gate LG receives two switched signals provided by one of the switches and one of the output signals C1'~C8' provided by the column re-queuing circuit 311 and outputs a logic signal to control ON/OFF of the current mirror CMR. Note that the input of the digital to analog converter provided by embodiments of the invention is not limited to a 6-bit signal. In addition, the current cells are not necessarily arranged in an array.

Figure 4A:
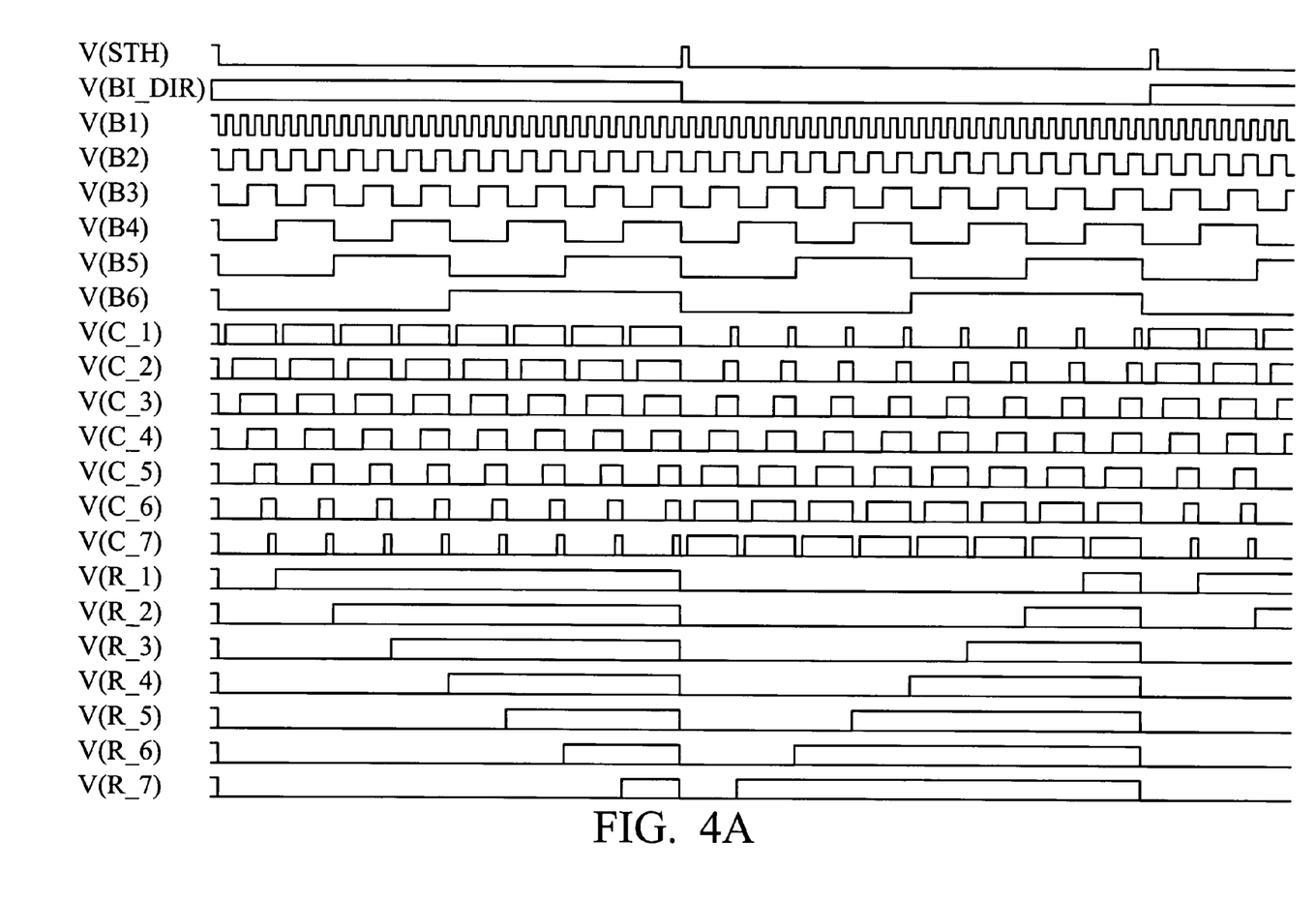
FIG. 4A shows output waveform simulation of each signal.
Figure 4B:
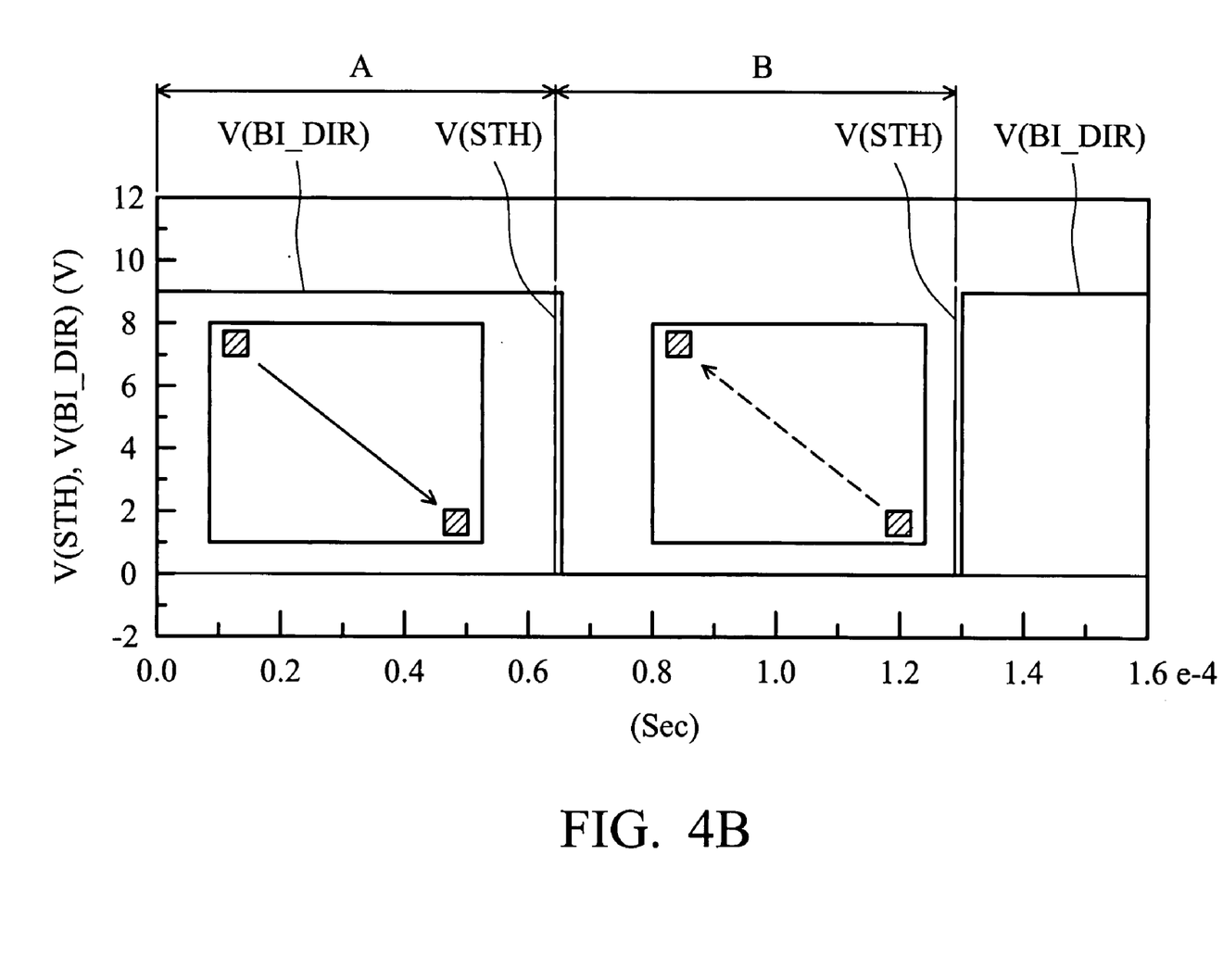
FIG. 4B shows an analog current output resulting from the signals shown in FIG. 4A.

FIG. 4A shows output waveform simulation of each signal. V(STH) stands for a voltage of the horizontal start pulse. V(BI_DIR) represents a voltage of the signal Bi_dir generated by the switch signal generator. V(B1)~V(B6) are voltages of the 6-bit digital input data. V(C_1)~V(C_7) and V(R_1)~V(R_7) are voltage of the re-queued decoded data generated by the column re-queuing circuit 310 and the row re-queuing circuit 311 respectively. In different periods, defined by the horizontal start pulses, the switching sequences of the re-queued decoded data are different. The resulting analog current output is shown in FIG. 4B. In the period A, V(BI_DIR) is a high voltage level and the turn-on sequence of the current cells in the current cell array is represented by an solid arrow. In the period B, V(BI_DIR) is a low voltage level and the turn-on sequence of the current cells in the current cell array is represented by a dashed arrow. Thus, the operational duration of each current cell in the digital to analog converter is substantially equivalent. The thin film devices are less affected by the current stress and a lifetime of the circuit is longer.

Figure 5:
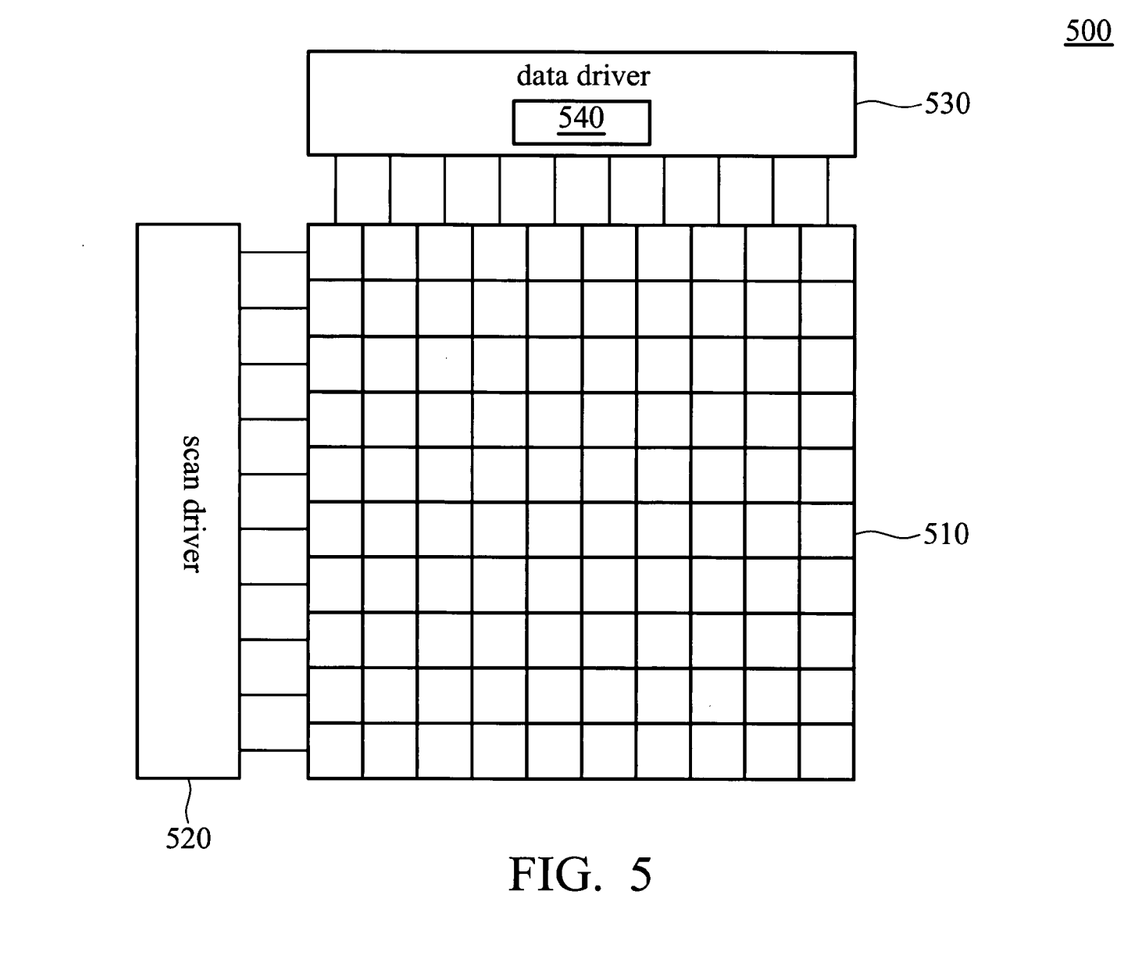
FIG. 5 shows a display comprising a digital to analog converter according to an embodiment of the invention.

A display according to another embodiment of the invention is shown in FIG. 5. The display 500 includes a pixel array 510, a scan driver 520 and a data driver 530. More specifically, the display 500 may be an OLED display. The scan driver 520 sequentially turns on a row of pixels in the pixel array 510. The data driver 530 includes a digital to analog converter 540. The digital to analog converter, the same as the one shown in FIGS. 3A and 3B, includes a digital data input, a column decoder, a row decoder, a re-queuing circuit and a plurality of current cells. The digital data input receives a digital input data. The decoder decodes the digital input data and generates a decoded data. The re-queuing circuit changes sequence of bits in the decoded data and outputs re-queued data. Each current cell includes a current source and an internal logic gate. The logic gate determines whether the current source outputs the current according to the re-queued data.

Embodiments of the invention provide a digital to analog converter. The vertical start pulse STV and horizontal start pulse STH of the OLED display are utilized to create a switch signal. The output data of the column decoder and the row decoder are re-queued according to the switch signal. The operational duration of each current cell in the digital to analog converter is thus substantially equivalent and circuit lifetime is longer. Output accuracy and reliability are both achieved by using the digital to analog converter according to embodiments of the invention.

While the invention has been described by way of example and in terms of preferred embodiment, it is to be understood that the invention is not limited thereto. To the contrary, it is intended to cover various modifications and (as would be apparent to those skilled in the art). Therefore, the scope of the appended claims should be accorded the broadest interpretation so as to encompass all such modifications.

What is claimed is:

1. A digital to analog converter, comprising:
    a digital data input;
    a column decoder electrically coupled to the digital data input;
    a row decoder electrically coupled to the digital data input;
    a column re-queuing circuit electrically coupled to the column decoder;
    a row re-queuing circuit electrically coupled to the row decoder; and
    a plurality of current cells electrically coupled to the column re-queuing circuit and to the row re-queuing circuit;
    wherein the column and row re-queuing circuits are bi-direction circuits for reversing bit sequences of corresponding column and row decoded data.

2. A display, comprising:
a panel having a plurality of pixels formed thereon;
a scan driver configured to sequentially drive each row of the pixels; and
a data driver having a digital to analog converter of claim 1, wherein the data driver is configured to provide a data signal to each column of the pixels.

3. The digital to analog converter of claim 1, wherein each of the current cells comprises a current source and an internal logic gate, wherein the internal logic gate is configured to receive a column re-queued decoded data from the column re-queuing circuit and to provide a logic signal for controlling ON/OFF of the current source.

4. The digital to analog converter of claim 3, further comprising a switch module for switching the column re-queued decoded data to control the internal logic gate in the corresponding current cell.

5. The digital to analog converter of claim 4, wherein the switch module is electrically coupled to the current cells and the column re-queuing circuit.

6. The digital to analog converter of claim 4, further comprising a switch signal generator electrically coupled to the switch module.

7. The digital to analog converter of claim 1, wherein each of the current cells comprises a current source and an internal logic gate, wherein the internal logic gate is configured to receive a row re-queued decoded data from the row re-queuing circuit current and to provide a logic signal for controlling ON/OFF of the current source.

8. The digital to analog converter of claim 7, further comprising a switch module for switching the row re-queued decoded data to control the internal logic gate in the corresponding current cell.

9. The digital to analog converter of claim 8, wherein the switch module is electrically coupled to the current cells and the row re-queuing circuit.

10. The digital to analog converter of claim 9, wherein the switch signal generator is electrically coupled to the switch module.

11. The digital to analog converter of claim 1, wherein the current cells are arranged in a matrix.

12. A method for converting a digital input into an analog output, the method comprising:
providing column and row digital input data;
decoding the column and the row digital input data to provide column decoded data and row decoded data;
re-queuing the column and the row decoded data into column re-queued decoded data and row re-queued decoded data; and
switching a plurality of current cells according to the column or row re-queued decoded data in specific sequence within different periods, wherein the switching comprises turning on the current cells in a first sequence within a first period and in a second sequence within a second period and wherein the first sequence is different than the second sequence, wherein not all the sequence in response to all the periods are the same.

13. The method of claim 12, wherein the first sequence is reversed to the second sequence.

14. The method of claim 12, further comprising providing a logic signal, in accordance with the re-queued decoded data, to control the current cells.

* * * * *